(12) United States Patent
Eder et al.

(10) Patent No.: US 10,795,399 B2
(45) Date of Patent: Oct. 6, 2020

(54) DEVICE THROUGHPUT OPTIMIZATION FOR BUS PROTOCOLS

(71) Applicant: Intel Corporation, Santa Clara, CA (US)

(72) Inventors: Patrik Eder, Taufkirchen (IT); Rolf Kuehnis, Portland, OR (US); Enrico Carrieri, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 15/855,381

(22) Filed: Dec. 27, 2017

(65) Prior Publication Data

US 2019/0033910 A1  Jan. 31, 2019

Related U.S. Application Data

(60) Provisional application No. 62/575,277, filed on Oct. 20, 2017.

(51) Int. Cl.

| G06F 1/12 | (2006.01) |
|---|---|
| G06F 1/08 | (2006.01) |
| G01R 31/317 | (2006.01) |
| G06F 13/40 | (2006.01) |
| G06F 13/42 | (2006.01) |
| G06F 13/00 | (2006.01) |
| G06F 1/10 | (2006.01) |
| H04L 7/10 | (2006.01) |

(Continued)

(52) U.S. Cl.
CPC ......... *G06F 1/12* (2013.01); *G01R 31/31726* (2013.01); *G01R 31/31727* (2013.01); *G06F 1/08* (2013.01); *G06F 13/00* (2013.01); *G06F 13/40* (2013.01); *G06F 13/4291* (2013.01); *G06F 1/10* (2013.01); *H04J 3/0685* (2013.01); *H04L 7/0008* (2013.01); *H04L 7/10* (2013.01)

(58) Field of Classification Search
CPC combination set(s) only.
See application file for complete search history.

(56) References Cited

U.S. PATENT DOCUMENTS

| 2009/0106608 A1* | 4/2009 | Grise ............. G01R 31/318541 714/726 |
| 2017/0255588 A1* | 9/2017 | Pitigoi-Aron ......... G06F 13/364 |
| 2018/0019863 A1* | 1/2018 | Liao ...................... H04L 7/0087 |

OTHER PUBLICATIONS

MEMS and Sensors Whitepaper Series: "Introduction to the MIPI I3C Standardized Sensor Interface", MIPI Alliance, Aug. 2016, 11 pages.

(Continued)

*Primary Examiner* — Raymond N Phan
(74) *Attorney, Agent, or Firm* — Schwegman Lundberg & Woessner, P.A.

(57) ABSTRACT

One embodiment provides a master device in a bus system. The master device includes bus interface circuitry to exchange commands and data with a slave device in communication with the master device; and test sequence generation logic to generate at least one test sequence, each test sequence having a corresponding unique clock signal having a unique clock frequency; the test sequence generation logic also to transmit the at least one test sequence and the corresponding unique clock signal to the slave device; the test signal generation logic also to determine, based on feedback from the slave device, if the slave device is capable of communicating with the master device using the unique clock frequency.

24 Claims, 9 Drawing Sheets

(51) Int. Cl.
*H04J 3/06* (2006.01)
*H04L 7/00* (2006.01)

(56) References Cited

OTHER PUBLICATIONS

Specification for I3CSM: "Improved Inter Integrated Circuit", MIPI Alliance, Version 1.0, Dec. 23, 2016, 199 pages.

* cited by examiner

DEVICE THROUGHPUT OPTIMIZATION FOR BUS PROTOCOLS

CROSS REFERENCE TO RELATED APPLICATIONS

This application claims the benefit of provisional application Ser. No. 62/575,277, filed Oct. 20, 2017; the contents of which is hereby incorporated by reference in its entirety.

FIELD

The present disclosure relates to throughput optimization for bus protocols. The terms "master" and "slave" are used in this disclosure only for their technical meaning. The term "master" may be substituted with the term "source", and the term "slave" may be substituted with the term "receiver".

BACKGROUND

Current serial bus protocols such as I3C, I2C, Serial Peripheral Interface (SPI), etc., rely on the capability of the receiver (slave) to keep up a data transfer speed set by a source (master). Typically, the serial bus protocols do not provide a mechanism to enable a source to determine the speed capabilities of the receiver a priori, and thus the sender must assume a lowest common clock speed for data transfers.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

Figure 1:
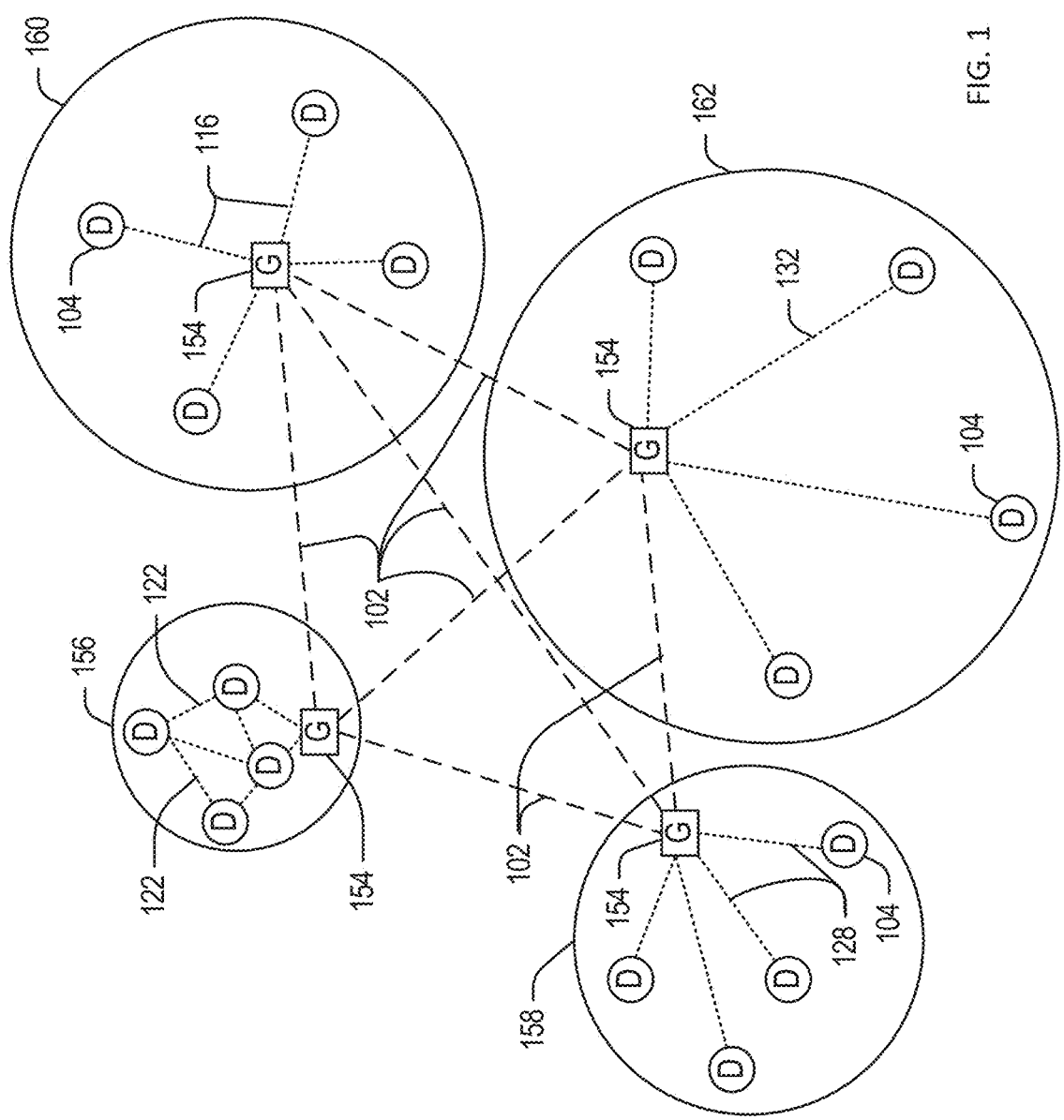
FIG. 1 illustrates a domain topology for respective internet-of-things (IoT) networks coupled through links to respective gateways, according to an example.

FIG. 1 illustrates an example domain topology for respective internet-of-things (IoT) networks coupled through links to respective gateways. The internet of things (IoT) is a concept in which a large number of computing devices are interconnected to each other and to the Internet to provide functionality and data acquisition at very low levels. Thus, as used herein, an IoT device may include a semiautonomous device performing a function, such as sensing or control, among others, in communication with other IoT devices and a wider network, such as the Internet.

Often, IoT devices are limited in memory, size, or functionality, allowing larger numbers to be deployed for a similar cost to smaller numbers of larger devices. However, an IoT device may be a smart phone, laptop, tablet, or PC, or other larger device. Further, an IoT device may be a virtual device, such as an application on a smart phone or other computing device. IoT devices may include IoT gateways, used to couple IoT devices to other IoT devices and to cloud applications, for data storage, process control, and the like. Networks of IoT devices may include commercial and home automation devices, such as water distribution systems, electric power distribution systems, pipeline control systems, plant control systems, light switches, thermostats, locks, cameras, alarms, motion sensors, and the like. The IoT devices may be accessible through remote computers, servers, and other systems, for example, to control systems or access data.

Figure 2:
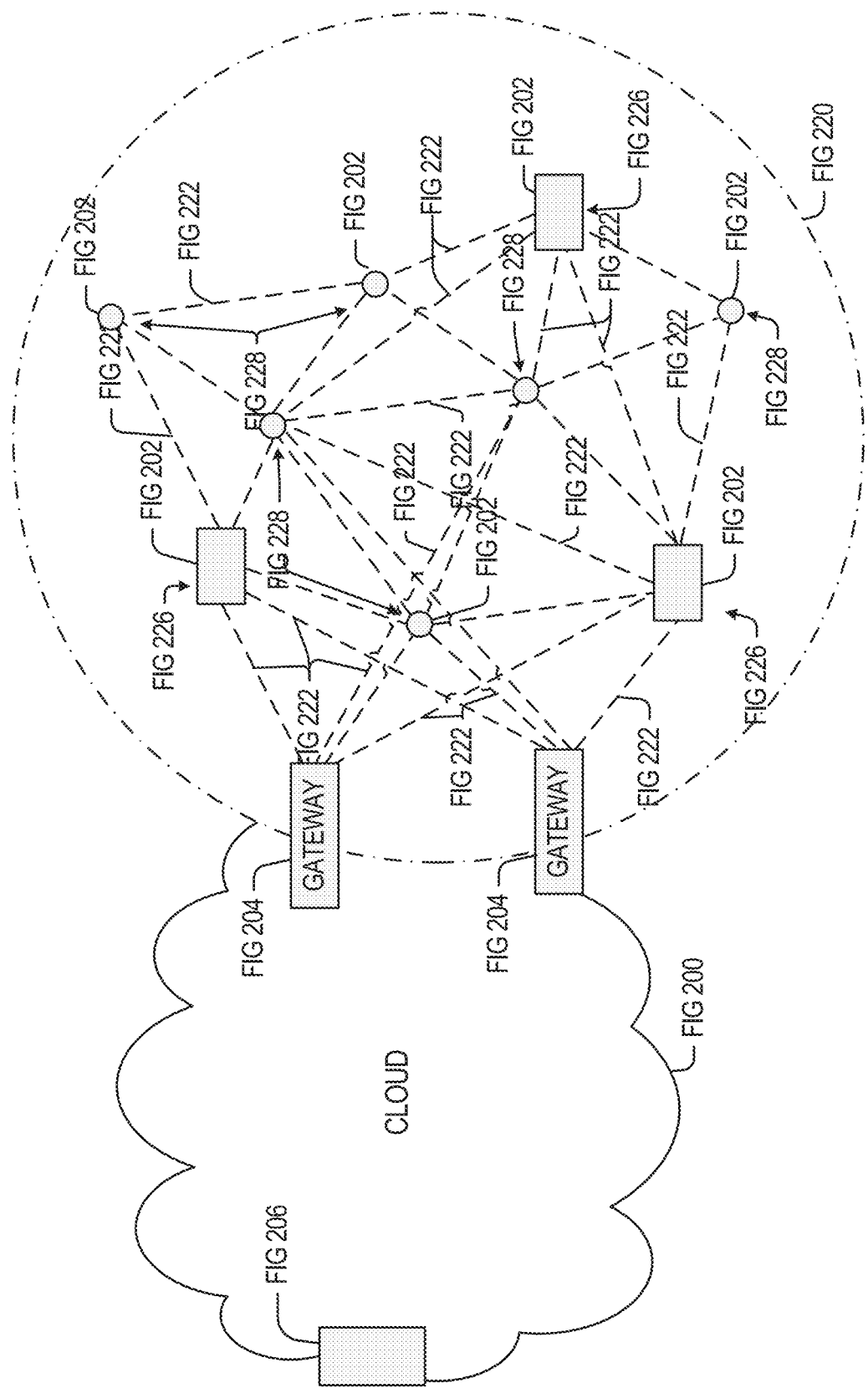
FIG. 2 illustrates a cloud computing network in communication with a mesh network of IoT devices operating as a fog device at the edge of the cloud computing network, according to an example.

The future growth of the Internet and like networks may involve very large numbers of IoT devices. Accordingly, in the context of the techniques discussed herein, a number of innovations for such future networking will address the need for all these layers to grow unhindered, to discover and make accessible connected resources, and to support the ability to hide and compartmentalize connected resources. Any number of network protocols and communications standards may be used, wherein each protocol and standard is designed to address specific objectives. Further, the protocols are part of the fabric supporting human accessible services that operate regardless of location, time or space. The innovations include service delivery and associated infrastructure, such as hardware and software; security enhancements; and the provision of services based on Quality of Service (QoS) terms specified in service level and service delivery agreements. As will be understood, the use of IoT devices and networks, such as those introduced in FIGS. 1 and 2, present a number of new challenges in a heterogeneous network of connectivity comprising a combination of wired and wireless technologies.

FIG. 1 specifically provides a simplified drawing of a domain topology that may be used for a number of internet-of-things (IoT) networks comprising IoT devices 104, with the IoT networks 156, 158, 160, 162, coupled through backbone links 102 to respective gateways 154. For example, a number of IoT devices 104 may communicate with a gateway 154, and with each other through the gateway 154. To simplify the drawing, not every IoT device 104, or communications link (e.g., link 116, 122, 128, or 132) is labeled. The backbone links 102 may include any number of wired or wireless technologies, including optical networks, and may be part of a local area network (LAN), a wide area network (WAN), or the Internet. Additionally, such communication links facilitate optical signal paths among both IoT devices 104 and gateways 154, including the use of MUXing/deMUXing components that facilitate interconnection of the various devices.

The network topology may include any number of types of IoT networks, such as a mesh network provided with the network 156 using Bluetooth low energy (BLE) links 122. Other types of IoT networks that may be present include a wireless local area network (WLAN) network 158 used to communicate with IoT devices 104 through IEEE 802.11 (Wi-Fi®) links 128, a cellular network 160 used to communicate with IoT devices 104 through an LTE/LTE-A (4G) or 5G cellular network, and a low-power wide area (LPWA) network 162, for example, a LPWA network compatible with the LoRaWan specification promulgated by the LoRa alliance, or a IPv6 over Low Power Wide-Area Networks (LPWAN) network compatible with a specification promulgated by the Internet Engineering Task Force (IETF). Further, the respective IoT networks may communicate with an outside network provider (e.g., a tier 2 or tier 3 provider) using any number of communications links, such as an LTE cellular link, an LPWA link, or a link based on the IEEE 802.15.4 standard, such as Zigbee®. The respective IoT networks may also operate with use of a variety of network and internet application protocols such as Constrained Application Protocol (CoAP). The respective IoT networks may also be integrated with coordinator devices that provide a chain of links that forms cluster tree of linked devices and networks.

Each of these IoT networks may provide opportunities for new technical features, such as those as described herein. The improved technologies and networks may enable the exponential growth of devices and networks, including the use of IoT networks into as fog devices or systems. As the use of such improved technologies grows, the IoT networks may be developed for self-management, functional evolution, and collaboration, without needing direct human intervention. The improved technologies may even enable IoT networks to function without centralized controlled systems. Accordingly, the improved technologies described herein may be used to automate and enhance network management and operation functions far beyond current implementations.

In an example, communications between IoT devices 104, such as over the backbone links 102, may be protected by a decentralized system for authentication, authorization, and accounting (AAA). In a decentralized AAA system, distributed payment, credit, audit, authorization, and authentication systems may be implemented across interconnected heterogeneous network infrastructure. This allows systems and networks to move towards autonomous operations. In these types of autonomous operations, machines may even contract for human resources and negotiate partnerships with other machine networks. This may allow the achievement of mutual objectives and balanced service delivery against outlined, planned service level agreements as well as achieve solutions that provide metering, measurements, traceability and trackability. The creation of new supply chain structures and methods may enable a multitude of services to be created, mined for value, and collapsed without any human involvement.

Such IoT networks may be further enhanced by the integration of sensing technologies, such as sound, light, electronic traffic, facial and pattern recognition, smell, vibration, into the autonomous organizations among the IoT devices. The integration of sensory systems may allow systematic and autonomous communication and coordination of service delivery against contractual service objectives, orchestration and quality of service (QoS) based swarming and fusion of resources. Some of the individual examples of network-based resource processing include the following.

The mesh network 156, for instance, may be enhanced by systems that perform inline data-to-information transforms. For example, self-forming chains of processing resources comprising a multi-link network may distribute the transformation of raw data to information in an efficient manner, and the ability to differentiate between assets and resources and the associated management of each. Furthermore, the proper components of infrastructure and resource based trust and service indices may be inserted to improve the data integrity, quality, assurance and deliver a metric of data confidence.

The WLAN network 158, for instance, may use systems that perform standards conversion to provide multi-standard connectivity, enabling IoT devices 104 using different protocols to communicate. Further systems may provide seamless interconnectivity across a multi-standard infrastructure comprising visible Internet resources and hidden Internet resources. Communications in the cellular network 160, for instance, may be enhanced by systems that offload data, extend communications to more remote devices, or both. The LPWA network 162 may include systems that perform non-Internet protocol (IP) to IP interconnections, addressing, and routing. Further, each of the IoT devices 104 may include the appropriate transceiver for wide area communications with that device. Further, each IoT device 104 may include other transceivers for communications using additional protocols and frequencies. This is discussed further with respect to the communication environment and hardware of an IoT processing device depicted in FIGS. 8 and 9.

Finally, clusters of IoT devices may be equipped to communicate with other IoT devices as well as with a cloud network. This may allow the IoT devices to form an ad-hoc network between the devices, allowing them to function as a single device, which may be termed a fog device. This configuration is discussed further with respect to FIG. 2 below.

FIG. 2 illustrates a cloud computing network in communication with a mesh network of IoT devices (devices 202) operating as a fog device at the edge of the cloud computing network. The mesh network of IoT devices may be termed a fog 220, operating at the edge of the cloud 200. To simplify the diagram, not every IoT device 202 is labeled.

The fog 220 may be considered to be a massively interconnected network wherein a number of IoT devices 202 are in communications with each other, for example, by radio links 222. As an example, this interconnected network may be facilitated using an interconnect specification released by the Open Connectivity Foundation™ (OCF). This standard allows devices to discover each other and establish communications for interconnects. Other interconnection protocols may also be used, including, for example, the optimized link state routing (OLSR) Protocol, the better approach to mobile ad-hoc networking (B.A.T.M.A.N.) routing protocol, or the OMA Lightweight M2M (LWM2M) protocol, among others.

Three types of IoT devices 202 are shown in this example, gateways 204, data aggregators 226, and sensors 228, although any combinations of IoT devices 202 and functionality may be used. The gateways 204 may be edge devices that provide communications between the cloud 200 and the fog 220, and may also provide the backend process function for data obtained from sensors 228, such as motion data, flow data, temperature data, and the like. The data aggregators 226 may collect data from any number of the sensors 228, and perform the back end processing function for the analysis. The results, raw data, or both may be passed along to the cloud 200 through the gateways 204. The sensors 228 may be full IoT devices 202, for example, capable of both collecting data and processing the data. In some cases, the sensors 228 may be more limited in functionality, for example, collecting the data and allowing the data aggregators 226 or gateways 204 to process the data.

Communications from any IoT device 202 may be passed along a convenient path (e.g., a most convenient path) between any of the IoT devices 202 to reach the gateways 204. In these networks, the number of interconnections provide substantial redundancy, allowing communications to be maintained, even with the loss of a number of IoT devices 202. Further, the use of a mesh network may allow IoT devices 202 that are very low power or located at a distance from infrastructure to be used, as the range to connect to another IoT device 202 may be much less than the range to connect to the gateways 204.

The fog 220 provided from these IoT devices 202 may be presented to devices in the cloud 200, such as a server 206, as a single device located at the edge of the cloud 200, e.g., a fog device. In this example, the alerts coming from the fog device may be sent without being identified as coming from a specific IoT device 202 within the fog 220. In this fashion, the fog 220 may be considered a distributed platform that provides computing and storage resources to perform processing or data-intensive tasks such as data analytics, data aggregation, and machine-learning, among others.

In some examples, the IoT devices 202 may be configured using an imperative programming style, e.g., with each IoT device 202 having a specific function and communication partners. However, the IoT devices 202 forming the fog device may be configured in a declarative programming style, allowing the IoT devices 202 to reconfigure their operations and communications, such as to determine needed resources in response to conditions, queries, and device failures. As an example, a query from a user located at a server 206 about the operations of a subset of equipment monitored by the IoT devices 202 may result in the fog 220 device selecting the IoT devices 202, such as particular sensors 228, needed to answer the query. The data from these sensors 228 may then be aggregated and analyzed by any combination of the sensors 228, data aggregators 226, or gateways 204, before being sent on by the fog 220 device to the server 206 to answer the query. In this example, IoT devices 202 in the fog 220 may select the sensors 228 used based on the query, such as adding data from flow sensors or temperature sensors. Further, if some of the IoT devices 202 are not operational, other IoT devices 202 in the fog 220 device may provide analogous data, if available.

Figure 3:
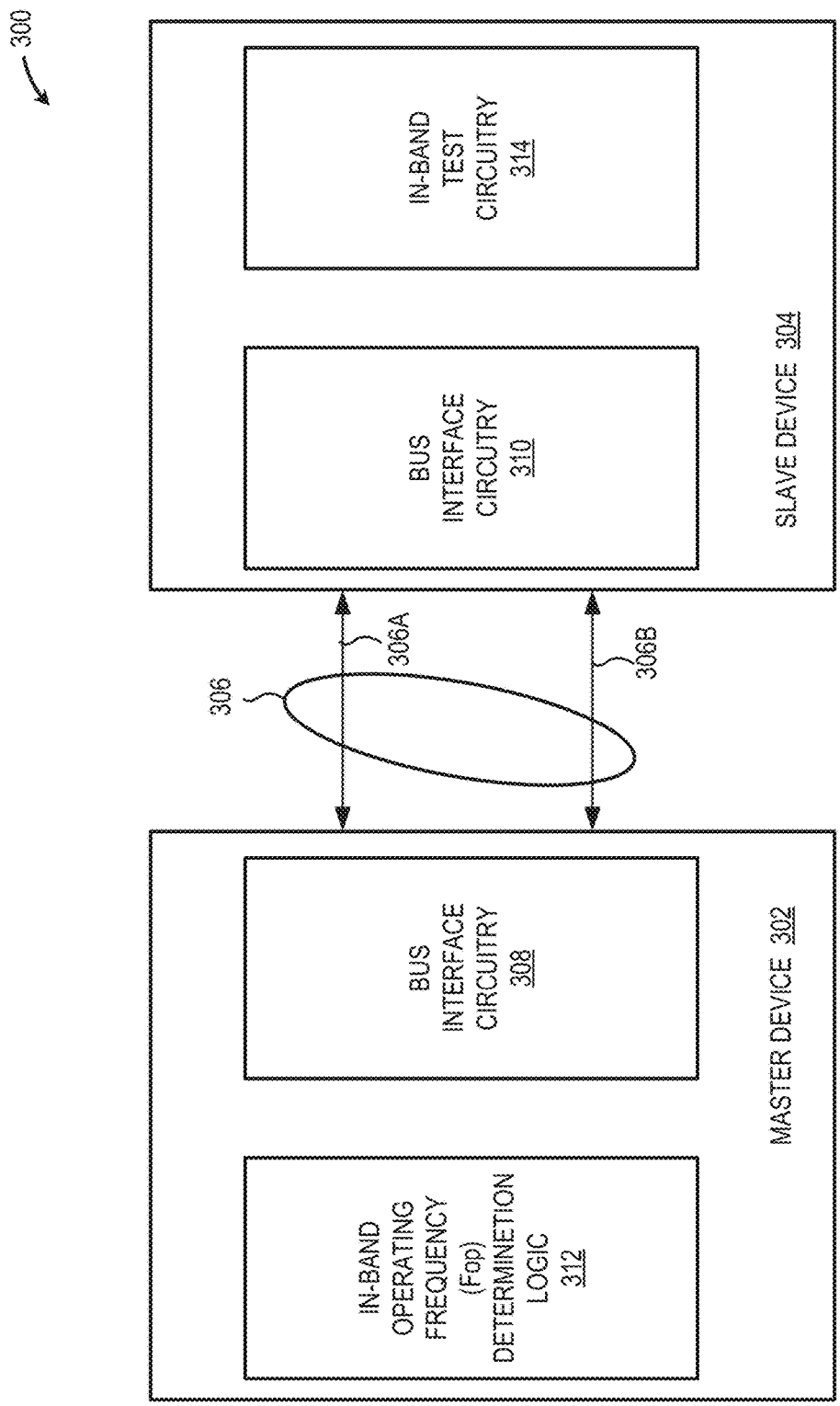
FIG. 3 illustrates a serial bus system consistent with several embodiments of the present disclosure.

FIG. 3 illustrates a bus system 300 consistent with several embodiments of the present disclosure. System 300 may include a master device 302 configured to exchange commands and data with a slave device 304, via bus 306. The master device 302 and slave device 304 may include any type of circuitry that is configured, or may be configured, to communicate using a serial bus 306, for examples, sensors, data transfer components, and indeed the master device 302 and slave device 304 are disclosed herein as intending to cover a wide range of devices that are coupled via a bus. The bus 306 may include a two-wire serial bus that includes a clock signal line 306A and a data signal line 306B. System 300 may correspond to components of a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone. While the bus system 300 illustrates a single master device 302 and a single slave device 304, it is to be understood that the bus system 300 may include a plurality of master devices and/or a plurality of slave devices in communication with each other via bus 306.

In some embodiments, the master device 302 includes bus interface circuitry 308 generally configured to receive and transmit signals, via bus 306, according to a serial bus communication protocol. Similarly, slave device 304 includes bus interface circuitry 310 generally configured to receive and transmit signals, via bus 306, according to a serial bus communication. The bus interface circuitry 308 and 310 and the serial bus 106 may comply, or be compatible with, a two-wire serial bus protocol such as an I3C bus communication protocol defined by the "MIPI Alliance, MEMS And Sensors Whitepaper Series—Introduction to the MIPI I3C Standardized Sensor Interface" (August 2016), and/or an I2C bus communication protocol defined by the "UM10204 I2C-Bus Specification And User Manual", Rev. 6—4 Apr. 2014, and/or an SPI bus communication protocol defined by the "SPI Block Guide" V03.06 (Original Release Date: 21 Jan. 2000, Revised: 4 Feb. 2003), and/or earlier and/or later version/revisions of these standards. Of course, in other embodiments, bus interface circuitry 308 and/or 310 and bus 306 may comply or be compatible with other bus communication protocols, including parallel bus architectures, multilane serial bus architectures, other two-wire bus communication protocols, etc.

In the embodiments described herein, to enable the master device 302 to determine the speed capabilities of a slave device 304 coupled thereto, the master device 302 also includes in-band operating frequency determination logic 312. Logic 312 is generally configured to generate a first test sequence having a known bit length and/or packet length and transmit the test sequence to the slave device 302 using a first operating frequency (first clock rate). The first clock may include a known, good clock rate, for example, the clock used for initialization. If the first test sequence is accurately detected by the slave device 304 (as may be determined, for example, by an acknowledgement (ACK) signal message sent by the slave device 304), logic 312 is generally configured to generate a second test sequence having a known bit length and/or packet length and transmit the second test sequence to the slave device 302 using a second operating frequency (second clock rate). The second clock rate has a greater frequency than the first clock rate. If the second test sequence is accurately detected by the slave device 304, logic 312 may also be configured to generate third and/or subsequent test sequences at increasing clock rates to determine the highest operating speed of the slave device 304. Logic 312 may continue generating test sequences at increasing clock rates until the slave device 304 indicates a failure to detect a given test sequence at a given clock rate. The operating frequency of communication between the master device 302 and the slave device 304 may be selected to correspond to the fastest speed at which the slave device 304 accurately detected a test sequence. In other words, the safest and fastest operating frequency may be selected, as determined by logic 312. In general, logic 312 is configured to generate test sequences during operation of the bus system 300, i.e., as an in-band test mode after initial communication between the mater device 302 and the slave device 304 are established.

In the embodiments described, to enable detection of the test sequences generated by logic 312, the slave device 304 includes in-band test circuitry 314 generally configured to determine if the clock signal generated by the master device is compatible with a local clock signal of the slave device, and to store and count the received test sequence received at a given operating frequency, as will be described in greater detail below.

Figure 4:
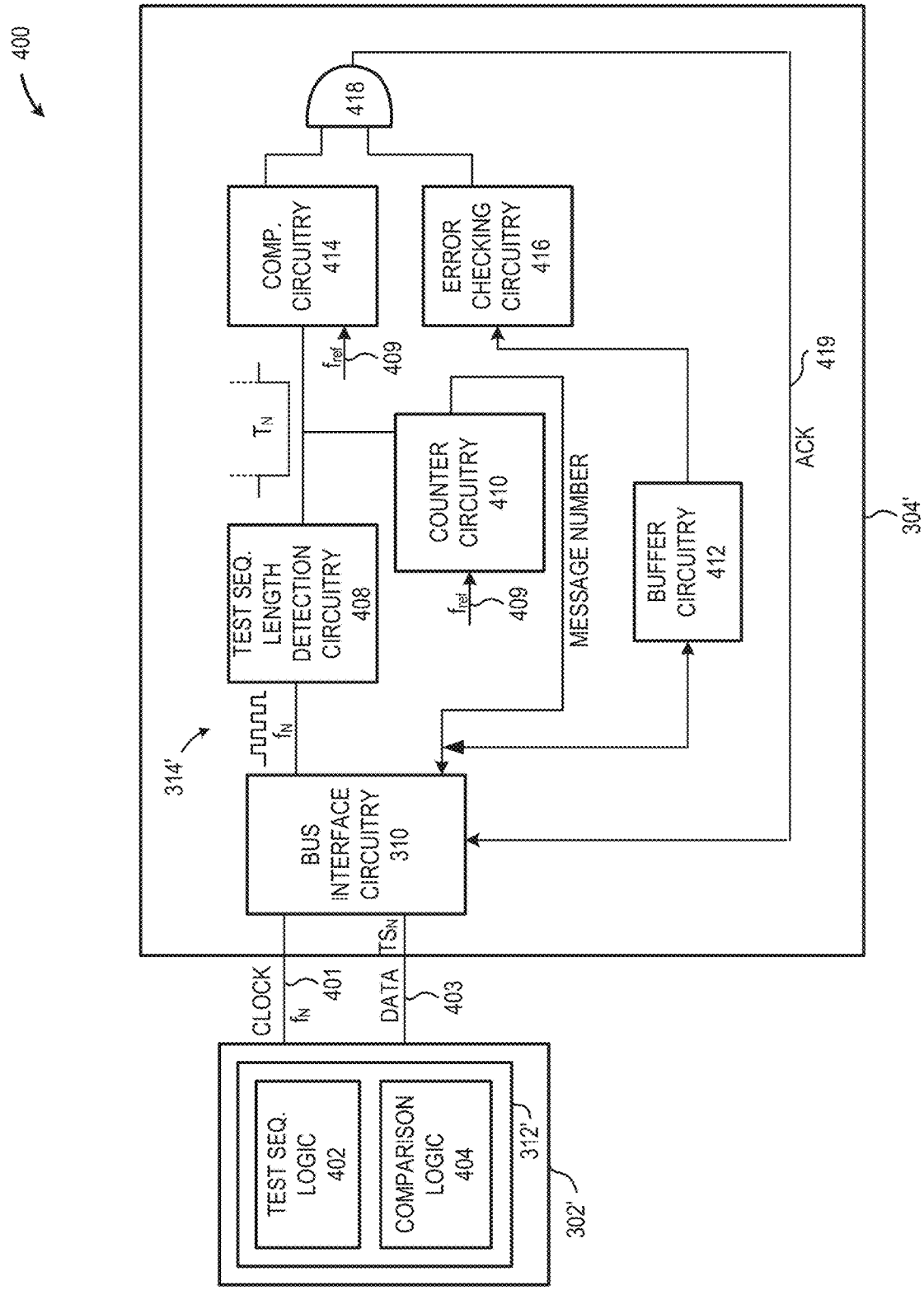
FIG. 4 illustrates a serial bus system according to one embodiment of the present disclosure.

FIG. 4 illustrates a bus system 400 according to one embodiment of the present disclosure. In this embodiment, the in-band operating frequency determination logic includes test sequence logic 402 generally configured to generate a test sequence (data) TSn 403 and a corresponding clock signal fn, and comparison logic 404 generally configured to compare the results of the test sequence generated by logic 402 to the test sequence received by the slave device 304'. The first test sequence, TS1, is generated using a first clock frequency f1, the second test sequence, TS2, is generated at a second clock frequency T2, and so on, until the test procedure stops. In some embodiments, f1<f2<f3 . . . <fn; where f1 is selected as the lowest clock frequency for a given communications protocol. The test sequence TSn, in some embodiments, is a data packet having a fixed length, e.g., 8, bits, 10 bits, 16 bits, etc. The bit length of the test sequence TSn may be determined by, for example, a defined field of a data frame defined by the I3C standard, a defined field of a data frame defined by the I2C standard, etc. The length of the test sequence may be communicated to the slave device 304' during initialization of a test mode. The clock signal, fn, generally toggles during the transmission of the test sequence TSn. Each clock signal fn may have a corresponding unique clock frequency, and each test sequence TSn may be unique for each unique frequency or the same for all frequencies. The number n of available clock frequencies may be based on, for example, a given bus communication protocol.

The in-band test circuitry 314' of this embodiment includes test sequence length detection circuitry 408 generally configured to receive the clock signal, fn, and determine a time period, Tn, during which the clock signal 401 is toggling (e.g., during which the test sequence TSn is transmitted to the slave device 304'). In some embodiments circuitry 408 may include low pass filter circuitry (not shown) generally configured to output a logic low value while the clock signal fn is toggling. The slave device 304' may be operating at a speed determined by a local (reference) clock signal, fref 409. As a general matter, in order for the slave device 304' to accurately sample the test sequence TSn, the local clock frequency fref 409 should be operating at a frequency such that at least two clock edges occur for every bit in the test sequence TSn. Thus, for example, if the test sequence TSn is 8 bits long, the local clock fref 409 should have a frequency such that at least 16 clock edges occur for the duration of the 8 bits of the test sequence (e.g., Nyquist-Shannon sampling theorem). To determine if the local clock signal fref 409 is fast enough to accurately sample the test sequence (TSn) at the given clock frequency fn, this embodiment also include comparator circuitry 414 generally configured to compare fn to fref 409. In one embodiment, comparator circuitry 414 is configured to compare fref to [2*fn]. If fref is greater than [2*fn], this indicates that fref is fast enough to accurately sample the test sequence at the current frequency fn, and the comparator circuitry 414 may output a logic signal (e.g., logic 1 or "high") indicative that the slave device can communicate with the master device 302' at the tested frequency fn. If fref is less than [2*fn], this indicates that fref is not fast enough to accurately sample the test sequence at the current frequency fn, and the comparator circuitry 414 may output a logic signal (e.g., logic 0 or "low") indicative that the slave device cannot communicate with the master device 302' at the tested frequency fn.

The in-band test circuitry 314' of this embodiment may also include counter circuitry 410 generally configured to count the number of test sequences that are received. In some embodiments, there may be multiple test sequences for a given test clock signal frequency fn, and counter circuitry 410 may be configured to count each test sequence within a given test clock signal frequency. In other embodiments, the counter circuitry 410 may be configured to generate a count of each test sequence of each test clock signal frequency. The count data may be returned to the master device 302', as described below. The in-band test circuitry 314' of this embodiment may also include buffer circuitry 412 generally configured to receive and store the current test sequence data as generated by the master device 302'. In some embodiments, the in-band test circuitry 314' may also include error checking circuitry 416 generally configured to receive the current test sequence data TSn (as stored in buffer circuitry 412) and determine if any errors are present in the test sequence data. For example, error checking circuitry 416 may be configured to determine a parity check of the test sequence data (e.g., cyclic redundancy check (CRC), etc.) and/or other error detection protocols such as, for example error correction code (ECC), etc. The error checking circuitry 416 may output a logic signal (e.g., logic 1 or "high") indicating that the error checking circuitry 416 did not find errors in the current test sequence, or a logic signal (e.g., logic 0 or "low") indicating that the error checking circuitry 416 found errors in the current test sequence.

The in-band test circuitry 314' of this embodiment may also include AND circuitry 418 generally configured to provide an AND operation of the output of the comparator circuitry 414 and the output of the error checking circuitry 416. The AND circuitry 418 may also be configured to generate an acknowledgement signal (ACK signal) 419, which may be transmitted to the master device 302'. If AND circuitry 418 generates an ACK signal 419, this indicates that the current test clock frequency rate, fn, is compatible with the local clock fref (as described above) and that error checking of the current test sequence TSn has passed. The results of the operations of the comparator circuitry 414 and the error checking circuitry 416 may provide an indication of the quality of the bus signal lines (e.g., interference levels, noise influence, etc.), however, oversampling effects may result in a false positive test result. Thus, in some embodiments, the in-band test circuitry 314' may also be configured to send current test sequence data (as stored in the buffer circuitry 412) along with the ACK signal 419 to the master device 302'. In addition, the in-band test circuitry 314' may also be configured to send current test sequence count data (as generated by counter circuitry 410) along with current test sequence data (as stored in the buffer circuitry 412) and the ACK signal 419 to the master device 302'. These operations may provide coherency between the master device 302' and the slave device 304' and may further provide information of the signal quality when commands and data are exchanged between the two devices. Accordingly, the comparison logic 404 of the master device 302' is configured to compare the test sequence data and/or test sequence count data sent by the test sequence logic 402 to test sequence data and/or test sequence count data stored by the slave device 302' to verify coherency of the test sequence data.

In operation, the test sequence data may continue to be generated by the test sequence logic 402 at increasing clock frequencies until the slave device 302' fails to provide an ACK signal and/or the comparison logic cannot verify the coherency of the test sequence data. At this point, the master device 302' may select the highest operating frequency that was verified by the slave device 304' and use that clock frequency for future communications between the master device 302' and the slave device 304'. Thus, a maximum operating frequency of the slave device can be determined.

In some embodiments, the test sequence logic 402 may be configured to generate test sequence data TSn using a plurality of unique encoding schemes, for example, single data rate (SDR), double data rate (DDR), ternary data rate, etc. In such embodiments, the test sequence logic 402 may be configured to cycle through an available set clock frequencies fn for each encoding scheme (until a given clock frequency has failed a verification), then the next encoding scheme is likewise cycle through an available set of clock frequencies, and so on, for each encoding scheme that may be supported. The comparison logic 404, in such embodiments, may also be configured to determine a maximum operating speed based on determined verified operating frequency and encoding scheme. Thus, for example, comparison logic 404 may determine that the maximum operating frequency is X for an SDR encoding scheme, and 0.8X for a DDR encoding scheme. In such an example, the logic 404 may select 0.8X as the operating frequency for communication between the master device 302' and the slave device 304', since this operating frequency using a DDR encoding scheme may provide increased throughput between the devices.

Figure 5:
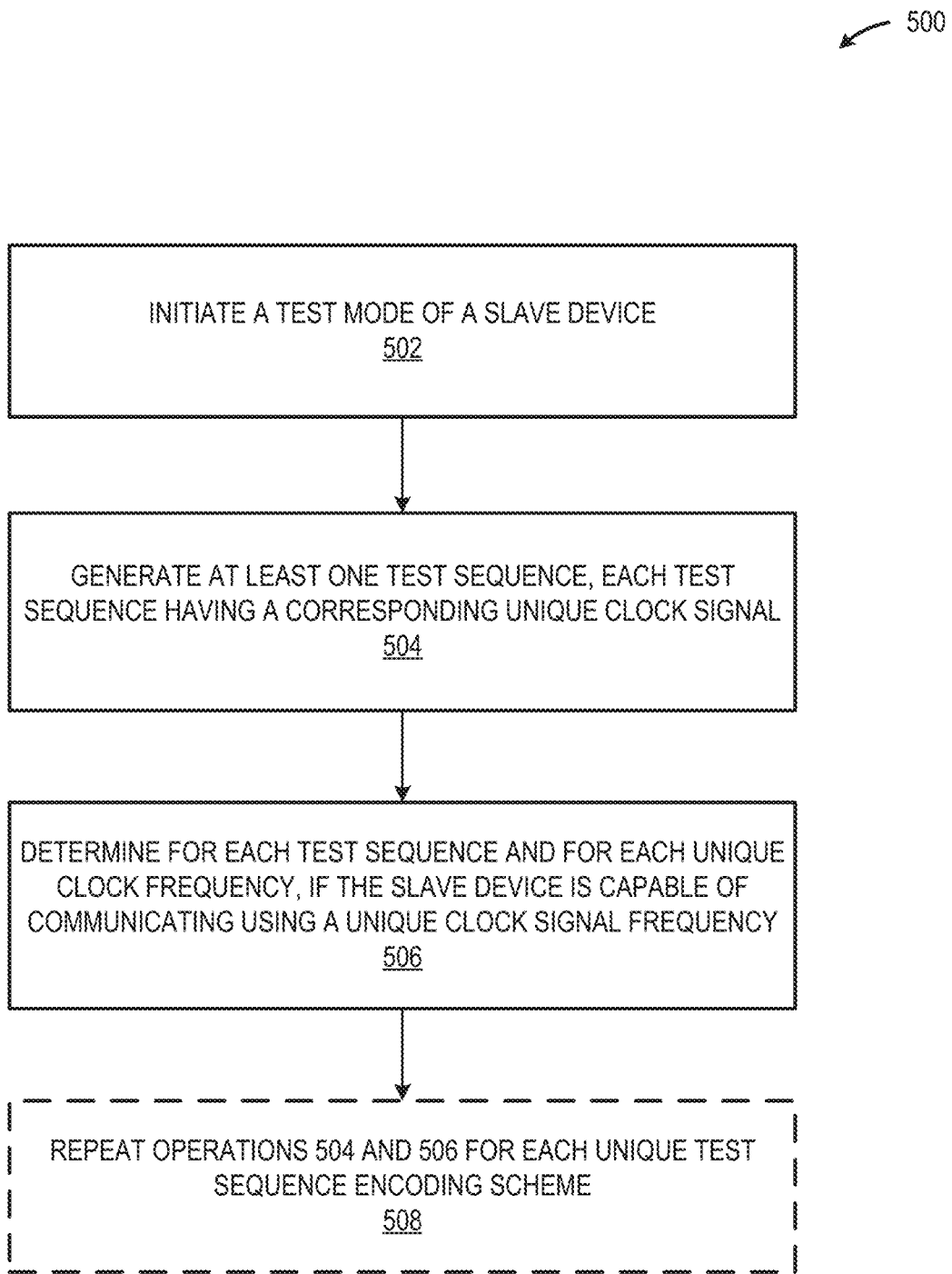
FIG. 5 is a flowchart illustrating operations according to one embodiment of the present disclosure.

FIG. 5 is a flowchart 500 illustrating operations according to one embodiment of the present disclosure. In particular, the flowchart 500 illustrates operations of a master device determining a maximum operating frequency of a slave device. Operations of this embodiment include initiating, by a master device, a test mode of a slave device in communication with the master device 502. The test mode may be initiated by, for example, an in-band communication of operational instructions (e.g., opcode) that instructs the slave device to enter into a test mode. Operations may also include generating, by the master device, at least one test sequence, each test sequence having a corresponding unique clock signal 504. For example, as described above, each clock signal frequency may be incremented to have an increased value from a previous clock signal frequency. In other embodiments, each clock signal frequency may be decremented to have a decreased value from a previous clock signal frequency. Operations of this embodiment may also include determining, by the master device for each test sequence and for each unique clock frequency, that the slave device is capable of communicating using the unique clock signal frequency 506. Operations of this embodiment may also include repeating operation 504 and 506 for each unique test sequence encoding scheme, and determining a maximum operating frequency for each unique encoding scheme 508.

Figure 6:
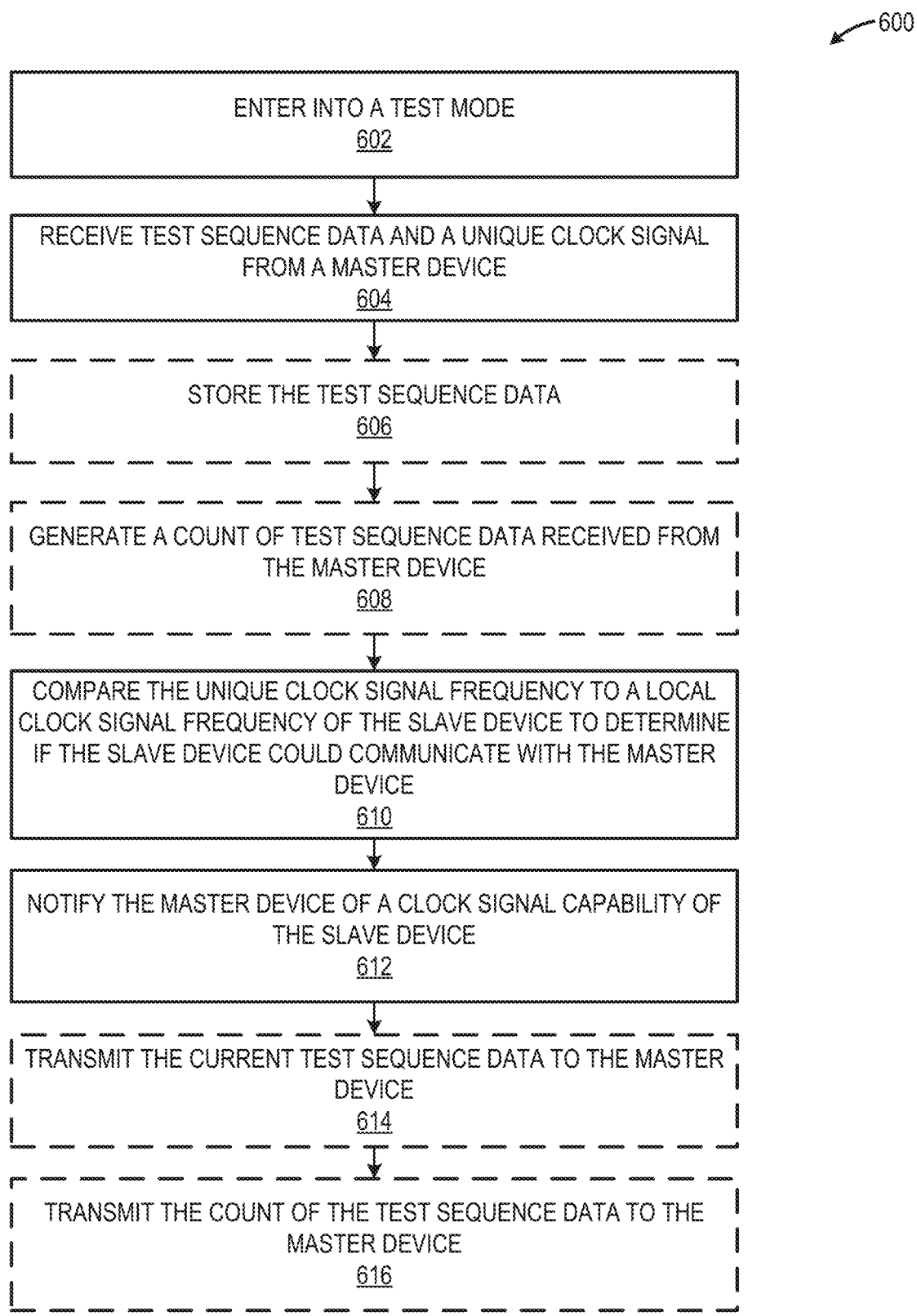
FIG. 6 is a flowchart illustrating operations according to another embodiment of the present disclosure.

FIG. 6 is a flowchart 600 illustrating operations according to another embodiment of the present disclosure. In particular, the flowchart 600 illustrates operations of a slave device determining a maximum operating frequency for communication with a master device. Operations of this embodiment include entering into a test mode 602. The test mode may be initiated by a master device in communication with the slave device. Operations of this embodiment also include receiving test sequence data and a unique clock signal (have a unique clock signal frequency) from a master device 604. Operations may also include storing the test sequence data 606 and/or generating a count of the test sequence data received from the master device 608. Operations also include comparing, by the slave device, the unique clock signal to a local clock signal to determine if the slave device is capable of communicating with the master device at the unique clock frequency 610. Operations also include notifying the master device of a clock signal capability of the slave device 612. Operations may also include transmitting current test sequence data to the master device 614 and/or transmitting the count of the test sequence data to the master device 616.

While the flowcharts of FIGS. 5 and 6 illustrate operations according various embodiments, it is to be understood that not all of the operations depicted in FIGS. 5 and 6 are necessary for other embodiments. In addition, it is fully contemplated herein that in other embodiments of the present disclosure, the operations depicted in FIGS. 5 and/or 6 and/or other operations described herein may be combined in a manner not specifically shown in any of the drawings, and such embodiments may include less or more operations than are illustrated in FIGS. 5 and/or 6. Thus, claims directed to features and/or operations that are not exactly shown in one drawing are deemed within the scope and content of the present disclosure.

Figure 7:
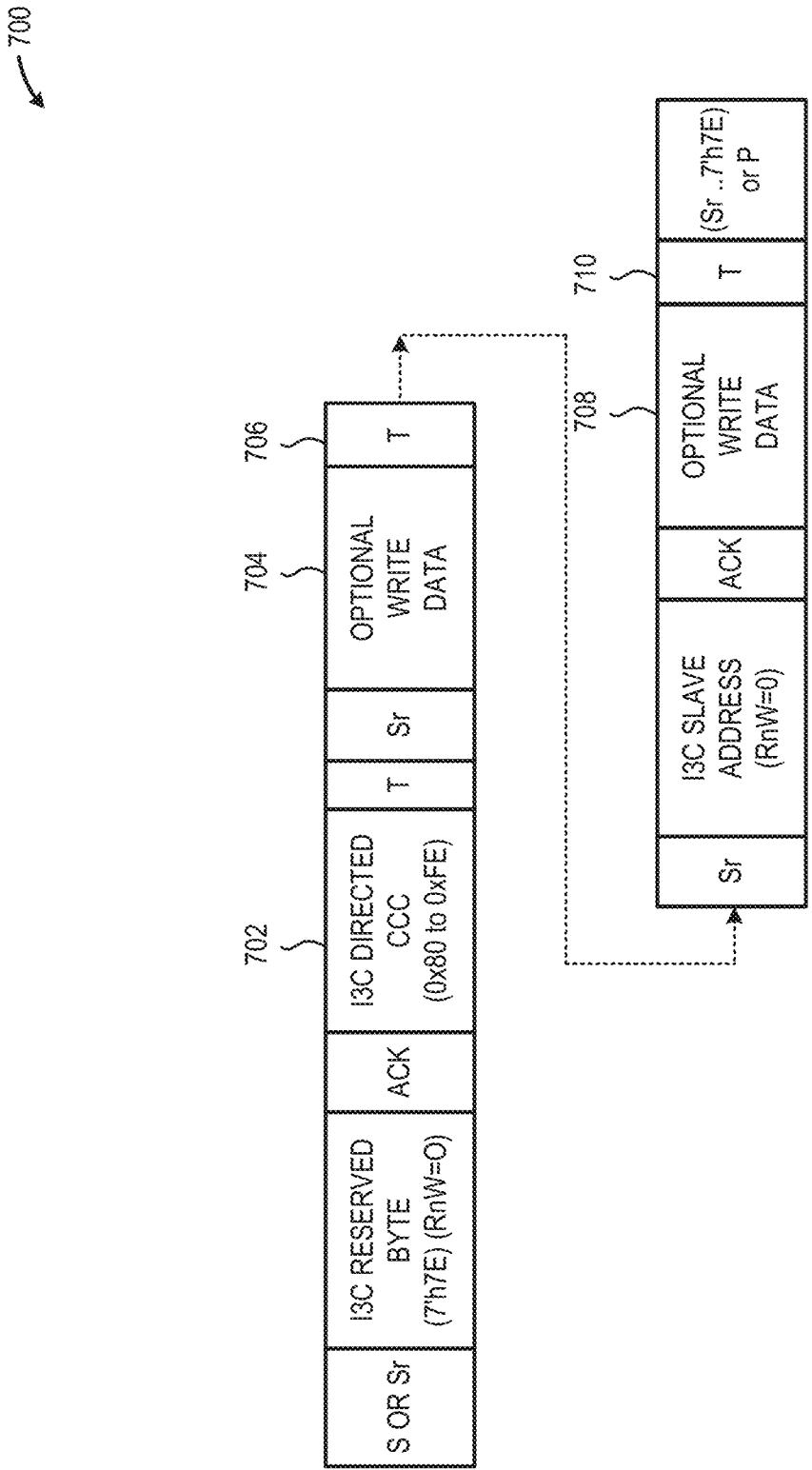
FIG. 7 illustrates an example I3C data frame according to one embodiment of the present disclosure.

As noted above, the bit length of the test sequence TSn may be determined by, for example, a defined field of a data frame defined by the I3C standard. FIG. 7 illustrates an example I3C data frame 700 of a master device according to one embodiment of the present disclosure. The data frame 700 includes a common-command code (CCC) field 702. In one embodiment, opcode may be included in the CCC field 702 to initiate a test mode with a slave device. The data frame 700 also includes an optional write data field 704. In at least one embodiment, the test sequence data may be inserted into field 704. The data frame 700 also includes a T field 706, which may be used as the ACK message from the slave device. For subsequent test sequences, the data frame may be repeated (as indicated by the dotted line) and include fields 708 and 710, similar to fields 704 and 706, to use for test sequences 2-n. Of course, in other embodiments, other bus protocols (e.g., I2C, SPI) may define data frames specific to those bus protocols.

In other examples, the operations and functionality described above with reference to FIGS. 3 to 7 may be embodied by a IoT device machine in the example form of an electronic processing system, within which a set or sequence of instructions may be executed to cause the electronic processing system to perform any one of the methodologies discussed herein, according to an example embodiment. The machine may be an IoT device or an IoT gateway, including a machine embodied by aspects of a personal computer (PC), a tablet PC, a personal digital assistant (PDA), a mobile telephone or smartphone, or any machine capable of executing instructions (sequential or otherwise) that specify actions to be taken by that machine. Further, while only a single machine may be depicted and referenced in the example above, such machine shall also be taken to include any collection of machines that individually or jointly execute a set (or multiple sets) of instructions to perform any one or more of the methodologies discussed herein. Further, these and like examples to a processor-based system shall be taken to include any set of one or more machines that are controlled by or operated by a processor (e.g., a computer) to individually or jointly execute instructions to perform any one or more of the methodologies discussed herein.

Figure 8:
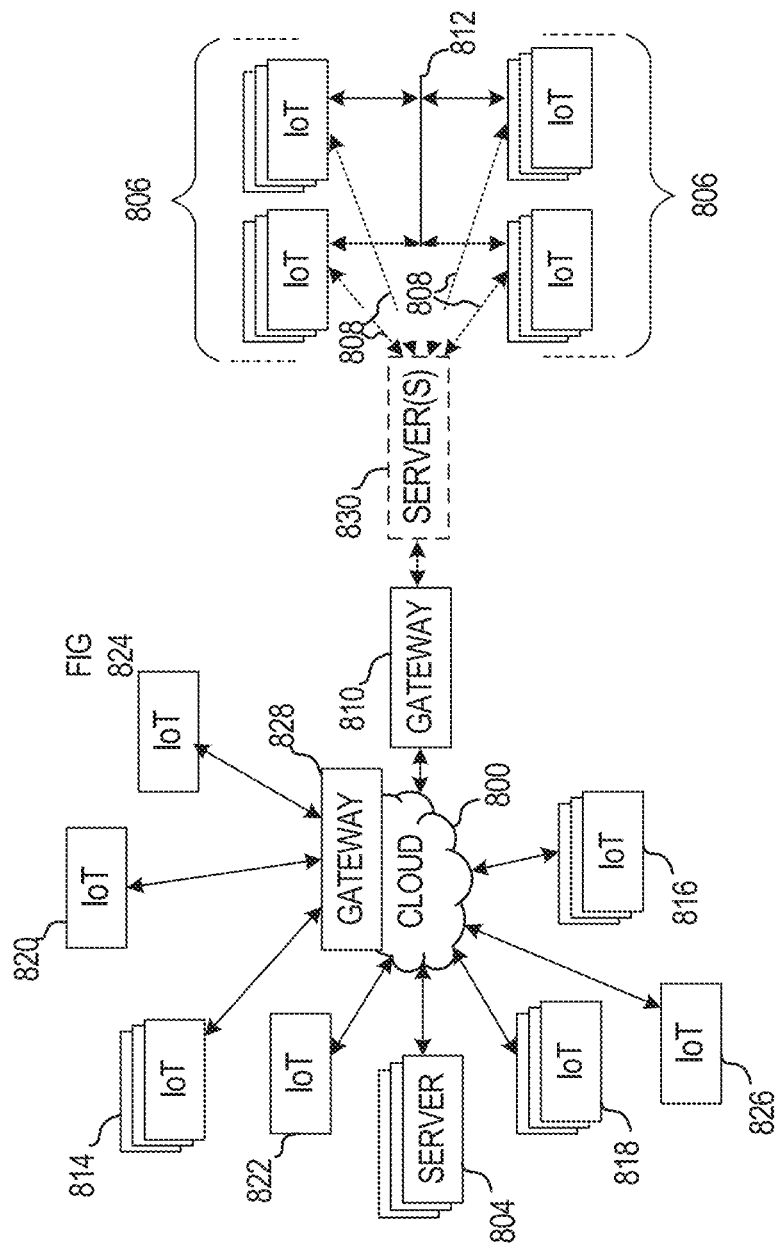
FIG. 8 illustrates a block diagram of a network illustrating communications among a number of IoT devices, according to an example.

FIG. 8 illustrates a drawing of a cloud computing network, or cloud 800, in communication with a number of Internet of Things (IoT) devices. The cloud 800 may represent the Internet, or may be a local area network (LAN), or a wide area network (WAN), such as a proprietary network for a company. The IoT devices may include any number of different types of devices, grouped in various combinations. For example, a traffic control group 806 may include IoT devices along streets in a city. These IoT devices may include stoplights, traffic flow monitors, cameras, weather sensors, and the like. The traffic control group 806, or other subgroups, may be in communication with the cloud 800 through wired or wireless links 808, such as LPWA links, optical links, and the like. Further, a wired or wireless sub-network 812 may allow the IoT devices to communicate with each other, such as through a local area network, a wireless local area network, and the like. The IoT devices may use another device, such as a gateway 810 or 828 to communicate with remote locations such as the cloud 800; the IoT devices may also use one or more servers 830 to facilitate communication with the cloud 800 or with the gateway 810. For example, the one or more servers 830 may operate as an intermediate network node to support a local edge cloud or fog implementation among a local area network. Further, the gateway 828 that is depicted may operate in a cloud-to-gateway-to-many edge devices configuration, such as with the various IoT devices 814, 820, 824 being constrained or dynamic to an assignment and use of resources in the cloud 800.

Other example groups of IoT devices may include remote weather stations 814, local information terminals 816, alarm systems 818, automated teller machines 820, alarm panels 822, or moving vehicles, such as emergency vehicles 824 or other vehicles 826, among many others. Each of these IoT devices may be in communication with other IoT devices, with servers 804, with another IoT fog device or system (not shown, but depicted in FIG. 2), or a combination therein. The groups of IoT devices may be deployed in various residential, commercial, and industrial settings (including in both private or public environments).

As can be seen from FIG. 8, a large number of IoT devices may be communicating through the cloud 800. This may allow different IoT devices to request or provide information to other devices autonomously. For example, a group of IoT devices (e.g., the traffic control group 806) may request a current weather forecast from a group of remote weather stations 814, which may provide the forecast without human intervention. Further, an emergency vehicle 824 may be alerted by an automated teller machine 820 that a burglary is in progress. As the emergency vehicle 824 proceeds towards the automated teller machine 820, it may access the traffic control group 806 to request clearance to the location, for example, by lights turning red to block cross traffic at an intersection in sufficient time for the emergency vehicle 824 to have unimpeded access to the intersection.

Clusters of IoT devices, such as the remote weather stations 814 or the traffic control group 806, may be equipped to communicate with other IoT devices as well as with the cloud 800. This may allow the IoT devices to form an ad-hoc network between the devices, allowing them to function as a single device, which may be termed a fog device or system (e.g., as described above with reference to FIG. 2).

Figure 9:
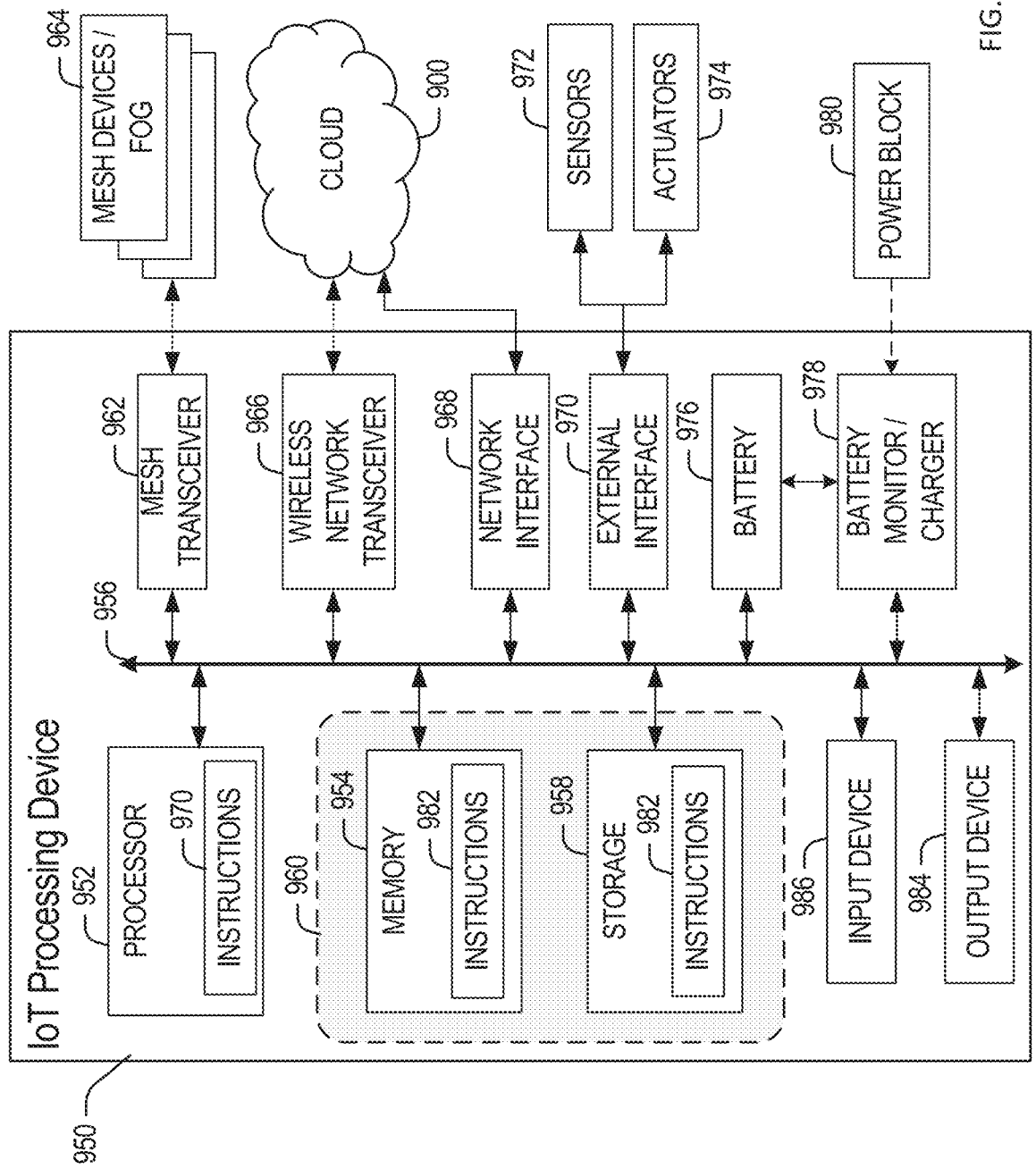
FIG. 9 illustrates a block diagram for an example IoT processing system architecture upon which any one or more of the techniques (e.g., operations, processes, methods, and methodologies) discussed herein may be performed, according to an example.

FIG. 9 is a block diagram of an example of components that may be present in an IoT device 950 for implementing the techniques described herein. The IoT device 950 may include any combinations of the components shown in the example or referenced in the disclosure above. The components may be implemented as ICs, portions thereof, discrete electronic devices, or other modules, logic, hardware, software, firmware, or a combination thereof adapted in the IoT device 950, or as components otherwise incorporated within a chassis of a larger system. Additionally, the block diagram of FIG. 9 is intended to depict a high-level view of components of the IoT device 950. However, some of the components shown may be omitted, additional components may be present, and different arrangement of the components shown may occur in other implementations.

The IoT device 950 may include a processor 952, which may be a microprocessor, a multi-core processor, a multi-threaded processor, an ultra-low voltage processor, an embedded processor, or other known processing element. The processor 952 may be a part of a system on a chip (SoC) in which the processor 952 and other components are formed into a single integrated circuit, or a single package, such as the Edison™ or Galileo™ SoC boards from Intel. As an example, the processor 952 may include an Intel® Architecture Core™ based processor, such as a Quark™, an Atom™, an i3, an i5, an i7, or an MCU-class processor, or another such processor available from Intel® Corporation, Santa Clara, Calif. However, any number other processors may be used, such as available from Advanced Micro Devices, Inc. (AMD) of Sunnyvale, Calif., a MIPS-based design from MIPS Technologies, Inc. of Sunnyvale, Calif., an ARM-based design licensed from ARM Holdings, Ltd. or customer thereof, or their licensees or adopters. The processors may include units such as an A5-A10 processor from Apple® Inc., a Snapdragon™ processor from Qualcomm® Technologies, Inc., or an OMAP™ processor from Texas Instruments, Inc.

The processor 952 may communicate with a system memory 954 over an interconnect 956 (e.g., a bus). Any number of memory devices may be used to provide for a given amount of system memory. As examples, the memory may be random access memory (RAM) in accordance with a Joint Electron Devices Engineering Council (JEDEC) design such as the DDR or mobile DDR standards (e.g., LPDDR, LPDDR2, LPDDR3, or LPDDR4). In various implementations the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 958 may also couple to the processor 952 via the interconnect 956. In an example the storage 958 may be implemented via a solid state disk drive (SSDD). Other devices that may be used for the storage 958 include flash memory cards, such as SD cards, microSD cards, xD picture cards, and the like, and USB flash drives. In low power implementations, the storage 958 may be on-die memory or registers associated with the processor 952. However, in some examples, the storage 958 may be implemented using a micro hard disk drive (HDD). Further, any number of new technologies may be used for the storage 958 in addition to, or instead of, the technologies described, such resistance change memories, phase change memories, holographic memories, or chemical memories, among others.

The components may communicate over the interconnect 956. The interconnect 956 may include any number of technologies, including industry standard architecture (ISA), extended ISA (EISA), peripheral component interconnect (PCI), peripheral component interconnect extended (PCIx), PCI express (PCIe), or any number of other technologies. The interconnect 956 may be a proprietary bus, for example, used in a SoC based system. Other bus systems may be included, such as an I2C interface, an SPI interface, point to point interfaces, and a power bus, among others.

The interconnect 956 may couple the processor 952 to a mesh transceiver 962, for communications with other mesh devices 964. The mesh transceiver 962 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the mesh devices 964. For example, a WLAN unit may be used to implement Wi-Fi™ communications in accordance with the Institute of Electrical and Electronics Engineers (IEEE) 802.11 standard. In addition, wireless wide area communications, e.g., according to a cellular or other wireless wide area protocol, may occur via a WWAN unit.

The mesh transceiver 962 may communicate using multiple standards or radios for communications at different range. For example, the IoT device 950 may communicate with close devices, e.g., within about 10 meters, using a local transceiver based on BLE, or another low power radio, to save power. More distant mesh devices 964, e.g., within about 50 meters, may be reached over ZigBee or other intermediate power radios. Both communications techniques may take place over a single radio at different power levels, or may take place over separate transceivers, for example, a local transceiver using BLE and a separate mesh transceiver using ZigBee.

A wireless network transceiver 966 may be included to communicate with devices or services in the cloud 900 via local or wide area network protocols. The wireless network transceiver 966 may be a LPWA transceiver that follows the IEEE 802.15.4, or IEEE 802.15.4g standards, among others. The IoT device 950 may communicate over a wide area using LoRaWAN™ (Long Range Wide Area Network) developed by Semtech and the LoRa Alliance. The techniques described herein are not limited to these technologies, but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the mesh transceiver 962 and wireless network transceiver 966, as described herein. For example, the radio transceivers 962 and 966 may include an LTE or other cellular transceiver that uses spread spectrum (SPA/SAS) communications for implementing high speed communications. Further, any number of other protocols may be used, such as Wi-Fi® networks for medium speed communications and provision of network communications.

The radio transceivers 962 and 966 may include radios that are compatible with any number of 3GPP (Third Generation Partnership Project) specifications, notably Long Term Evolution (LTE), Long Term Evolution-Advanced (LTE-A), and Long Term Evolution-Advanced Pro (LTE-A Pro). It can be noted that radios compatible with any number of other fixed, mobile, or satellite communication technologies and standards may be selected. These may include, for example, any Cellular Wide Area radio communication technology, which may include e.g. a 5th Generation (5G) communication systems, a Global System for Mobile Communications (GSM) radio communication technology, a General Packet Radio Service (GPRS) radio communication technology, or an Enhanced Data Rates for GSM Evolution (EDGE) radio communication technology, a UMTS (Universal Mobile Telecommunications System) communication technology, In addition to the standards listed above, any number of satellite uplink technologies may be used for the wireless network transceiver 966, including, for example, radios compliant with standards issued by the ITU (International Telecommunication Union), or the ETSI (European Telecommunications Standards Institute), among others. The examples provided herein are thus understood as being applicable to various other communication technologies, both existing and not yet formulated.

A network interface controller (NIC) 968 may be included to provide a wired communication to the cloud 900 or to other devices, such as the mesh devices 964. The wired communication may provide an Ethernet connection, or may be based on other types of networks, such as Controller Area Network (CAN), Local Interconnect Network (LIN), DeviceNet, ControlNet, Data Highway+, PROFIBUS, or PROFINET, among many others. An additional NIC 968 may be included to allow connect to a second network, for example, a NIC 968 providing communications to the cloud over Ethernet, and a second NIC 968 providing communications to other devices over another type of network.

The interconnect 956 may couple the processor 952 to an external interface 970 that is used to connect external devices or subsystems. The external devices may include sensors 972, such as accelerometers, level sensors, flow sensors, optical light sensors, camera sensors, temperature sensors, a global positioning system (GPS) sensors, pressure sensors, barometric pressure sensors, and the like. The external interface 970 further may be used to connect the IoT device 950 to actuators 974, such as power switches, valve actuators, an audible sound generator, a visual warning device, and the like.

In some optional examples, various input/output (I/O) devices may be present within, or connected to, the IoT device 950. For example, a display or other output device 984 may be included to show information, such as sensor readings or actuator position. An input device 986, such as a touch screen or keypad may be included to accept input. An output device 984 may include any number of forms of audio or visual display, including simple visual outputs such as binary status indicators (e.g., LEDs) and multi-character visual outputs, or more complex outputs such as display screens (e.g., LCD screens), with the output of characters, graphics, multimedia objects, and the like being generated or produced from the operation of the IoT device 950.

A battery 976 may power the IoT device 950, although in examples in which the IoT device 950 is mounted in a fixed location, it may have a power supply coupled to an electrical grid. The battery 976 may be a lithium ion battery, or a metal-air battery, such as a zinc-air battery, an aluminum-air battery, a lithium-air battery, and the like.

A battery monitor/charger 978 may be included in the IoT device 950 to track the state of charge (SoCh) of the battery 976. The battery monitor/charger 978 may be used to monitor other parameters of the battery 976 to provide failure predictions, such as the state of health (SoH) and the state of function (SoF) of the battery 976. The battery monitor/charger 978 may include a battery monitoring integrated circuit, such as an LTC4020 or an LTC2990 from Linear Technologies, an ADT7488A from ON Semiconductor of Phoenix Arizona, or an IC from the UCD90xxx family from Texas Instruments of Dallas, Tex. The battery monitor/charger 978 may communicate the information on the battery 976 to the processor 952 over the interconnect 956. The battery monitor/charger 978 may also include an analog-to-digital (ADC) convertor that allows the processor 952 to directly monitor the voltage of the battery 976 or the current flow from the battery 976. The battery parameters may be used to determine actions that the IoT device 950 may perform, such as transmission frequency, mesh network operation, sensing frequency, and the like.

A power block 980, or other power supply coupled to a grid, may be coupled with the battery monitor/charger 978 to charge the battery 976. In some examples, the power block 980 may be replaced with a wireless power receiver to obtain the power wirelessly, for example, through a loop antenna in the IoT device 950. A wireless battery charging circuit, such as an LTC4020 chip from Linear Technologies of Milpitas, Calif., among others, may be included in the battery monitor/charger 978. The specific charging circuits chosen depend on the size of the battery 976, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 958 may include instructions 982 in the form of software, firmware, or hardware commands to implement the techniques described herein. Although such instructions 982 are shown as code blocks included in the memory 954 and the storage 958, it may be understood that any of the code blocks may be replaced with hardwired circuits, for example, built into an application specific integrated circuit (ASIC).

In an example, the instructions 982 provided via the memory 954, the storage 958, or the processor 952 may be embodied as a non-transitory, machine readable medium 960 including code to direct the processor 952 to perform electronic operations in the IoT device 950. The processor 952 may access the non-transitory, machine readable medium 960 over the interconnect 956. For instance, the non-transitory, machine readable medium 960 may be embodied by devices described for the storage 958 of FIG. 9 or may include specific storage units such as optical disks, flash drives, or any number of other hardware devices. The non-transitory, machine readable medium 960 may include instructions to direct the processor 952 to perform a specific sequence or flow of actions, for example, as described with respect to the flowchart(s) and block diagram(s) of operations and functionality depicted above.

In further examples, a machine-readable medium also includes any tangible medium that is capable of storing, encoding or carrying instructions for execution by a machine and that cause the machine to perform any one or more of the methodologies of the present disclosure or that is capable of storing, encoding or carrying data structures utilized by or associated with such instructions. A "machine-readable medium" thus may include, but is not limited to, solid-state memories, and optical and magnetic media. Specific examples of machine-readable media include non-volatile memory, including but not limited to, by way of example, semiconductor memory devices (e.g., electrically programmable read-only memory (EPROM), electrically erasable programmable read-only memory (EEPROM)) and flash memory devices; magnetic disks such as internal hard disks and removable disks; magneto-optical disks; and CD-ROM and DVD-ROM disks. The instructions embodied by a machine-readable medium may further be transmitted or received over a communications network using a transmission medium via a network interface device utilizing any one of a number of transfer protocols (e.g., HTTP).

It should be understood that the functional units or capabilities described in this specification may have been referred to or labeled as components or modules, in order to more particularly emphasize their implementation independence. Such components may be embodied by any number of software or hardware forms. For example, a component or module may be implemented as a hardware circuit comprising custom very-large-scale integration (VLSI) circuits or gate arrays, off-the-shelf semiconductors such as logic chips, transistors, or other discrete components. A component or module may also be implemented in programmable hardware devices such as field programmable gate arrays, programmable array logic, programmable logic devices, or the like. Components or modules may also be implemented in software for execution by various types of processors. An identified component or module of executable code may, for instance, comprise one or more physical or logical blocks of computer instructions, which may, for instance, be organized as an object, procedure, or function. Nevertheless, the executables of an identified component or module need not be physically located together, but may comprise disparate instructions stored in different locations which, when joined logically together, comprise the component or module and achieve the stated purpose for the component or module.

Indeed, a component or module of executable code may be a single instruction, or many instructions, and may even be distributed over several different code segments, among different programs, and across several memory devices or processing systems. In particular, some aspects of the described process (such as code rewriting and code analysis) may take place on a different processing system (e.g., in a computer in a data center), than that in which the code is deployed (e.g., in a computer embedded in a sensor or robot). Similarly, operational data may be identified and illustrated herein within components or modules, and may be embodied in any suitable form and organized within any suitable type of data structure. The operational data may be collected as a single data set, or may be distributed over different locations including over different storage devices, and may exist, at least partially, merely as electronic signals on a system or network. The components or modules may be passive or active, including agents operable to perform desired functions.

Advantageously, the present disclosure provides a bus system that enables in-band determination of speed capabilities of a slave device. In additions, the operations and circuitry described herein enable speed determination of slave device while reducing or eliminating the influence of environmental and/or signal quality problems that may negatively impact the ability to accurately and efficiently obtain the speed capabilities of the slave device. Also advantageously, using an in-band testing procedure may enable the use of reserved fields of certain communication protocols (e.g., reserved fields of the I3C communication protocol), thereby enabling backward compatibility with existing communication protocols.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hard-wired circuitry, programmable circuitry, state machine circuitry, logic and/or firmware that stores instructions executed by programmable circuitry. The circuitry may be embodied as an integrated circuit, such as an integrated circuit chip, such as an application-specific integrated circuit (ASIC), etc. In some embodiments, the various components and circuitry of the memory controller circuitry or other systems may be combined in a system-on-a-chip (SoC) architecture.

Embodiments of the operations described herein may be implemented in a computer-readable storage device having stored thereon instructions that when executed by one or more processors perform the methods. The processor may include, for example, a processing unit and/or programmable circuitry associated with the master device 102 and/or slave device 104. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions. In some embodiments, the circuitry may be formed, at least in part, by a general-purpose processor executing code and/or instructions sets (e.g., software, firmware, etc.) corresponding to the functionality described herein, thus transforming a general-purpose processor into a specific-purpose processing environment to perform one or more of the operations described herein.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800™-2012: IEEE Standard for SystemVerilog—Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Additional examples of the presently described method, system, and device embodiments include the following, non-limiting configurations. Each of the following non-limiting examples may stand on its own, or may be combined in any permutation or combination with any one or more of the other examples provided below or throughout the present disclosure.

EXAMPLE 1

According to this example, there is provided a master device in a bus system. The master device includes bus interface circuitry to exchange commands and data with a slave device in communication with the master device; and test sequence generation logic to generate at least one test sequence, each test sequence having a corresponding unique clock signal having a unique clock frequency; the test sequence generation logic also to transmit the at least one test sequence and the corresponding unique clock signal to the slave device; the test signal generation logic also to determine, based on feedback from the slave device, if the slave device is capable of communicating with the master device using the unique clock frequency.

EXAMPLE 2

This example includes the elements of example 1, wherein the feedback from the slave device includes an acknowledgement signal indicating that the unique clock frequency is compatible with a local clock of the slave device.

EXAMPLE 3

This example includes the elements of example 1, wherein the master device further includes comparison logic and wherein the feedback from the slave device includes a copy of the at least one test sequence from the slave device; the comparison logic to compare the at least one test sequence generated by the test sequence generation logic to the copy of the at least one test sequence from the slave device.

EXAMPLE 4

This example includes the elements of example 1, wherein test sequence generation logic also to generate count data associated with each test sequence, and wherein the feedback from the slave device includes count data generated by the slave device; and wherein the comparison logic also to compare the count data generated by the test sequence generation logic to the count data generated by the slave device.

EXAMPLE 5

This example includes the elements of example 1, wherein the test sequence generation logic also to terminate generating the at least one test sequence if the feedback from the slave device indicates that the slave device is not capable of communicating with the master device using the unique clock frequency.

EXAMPLE 6

This example includes the elements of example 1, wherein the test sequence generation logic also to set a clock frequency to communicate with the slave to device to the last unique clock frequency at which the slave device provided feedback that the slave device is capable of communicating at that unique clock frequency.

EXAMPLE 7

This example includes the elements of example 1, wherein the bus interface circuitry is configured to exchange commands and data with the slave device using a two-wire serial bus communication protocol.

EXAMPLE 8

This example includes the elements of example 1, wherein the test sequence generation logic also to iteratively generate a test sequence, each test sequence having an increasing unique clock frequency.

EXAMPLE 9

This example includes the elements of example 1, wherein the test sequence generation logic also to generate the at least one test sequence as an in-band operation during communication with the slave device.

EXAMPLE 10

This example provides a slave device in a bus system. The slave device includes bus interface circuitry to exchange commands and data with a master device in communication with the slave device; and test circuitry to receive a test sequence and a unique clock signal from the master device, and further to determine if a unique clock frequency associated with the unique clock signal is compatible with a local clock signal of the slave device to enable communication with the master device; the test circuitry also to generate a feedback signal, to send to the master device, indicating the capability of the slave device to communicate with the master device using the unique clock frequency.

EXAMPLE 11

This example includes the elements of example 10 wherein the test circuitry includes:
test sequence length detection circuitry to determine a time length of the test sequence received from the master device; and
comparison circuitry to compare the time length of the test sequence to the local clock signal and generate a first output signal having state indicating that the local clock signal has a frequency that is sufficient to sample the test sequence or a second output signal indicating that the local clock signal has a frequency that is insufficient to sample the test sequence.

EXAMPLE 12

This example includes the elements of example 11, wherein the test circuitry further includes:
error detection circuitry to perform at least one error detection operation on the test sequence received from the master device and to generate a first output signal indicating that the error detection operation did not detect any errors in the test sequence received or a second output signal indicating that the error detection operation detected at least one error in the test sequence received; and
AND circuitry to AND the first or second output signals of the comparison circuitry with the first or second output signals of the error detection circuitry, the AND circuitry also to generate an output signal indicating the result of the AND operation; and wherein the feedback signal includes the output of the AND circuitry.

EXAMPLE 13

This example includes the elements of example 10, wherein the test circuitry includes:
buffer circuitry to store the test sequence received from the slave device; and wherein the feedback signal includes the test sequence stored in the buffer.

EXAMPLE 14

This example includes the elements of example 10, wherein the test circuitry includes:
count circuitry to generate count data of the test sequence received from the master device; and wherein the feedback signal includes the count data.

EXAMPLE 15

This example includes the elements of example 10, wherein the bus interface circuitry is configured to exchange commands and data with the master device using a two-wire serial bus communication protocol.

EXAMPLE 16

This example includes the elements of example 10, wherein the test circuitry also to determine if a unique clock frequency associated with the unique clock signal is compatible with a local clock signal of the slave device to enable communication with the master device as an in-band operation during communication with the master device.

EXAMPLE 17

This example provides a computer-readable storage device of a master device in a bus system, the computer-readable storage device having stored thereon instructions that when executed by one or more processors result in the following operations comprising:
exchange commands and data with a slave device in communication with the master device; and generate at least one test sequence, each test sequence having a corresponding unique clock signal having a unique clock frequency;

transmit the at least one test sequence and the corresponding unique clock signal to the slave device; and determine, based on feedback from the slave device in response to the test sequence, if the slave device is capable of communicating with the master device using the unique clock frequency.

EXAMPLE 18

This example includes the elements of example 17, wherein the feedback from the slave device includes an acknowledgement signal indicating that the unique clock frequency is compatible with a local clock of the slave device.

EXAMPLE 19

This example includes the elements of example 17, wherein the instructions that when executed by the one or more processors result in the following additional operations comprising:

compare the at least one test sequence generated by the master device to a copy of the at least one test sequence from the slave device.

EXAMPLE 20

This example includes the elements of example 19, wherein the instructions that when executed by the one or more processors result in the following additional operations comprising:

generate count data associated with each test sequence, and wherein the feedback from the slave device includes count data generated by the slave device; and compare the count data generated by master device to the count data generated by the slave device.

EXAMPLE 21

This example includes the elements of example 17, wherein the instructions that when executed by the one or more processors result in the following additional operations comprising:

terminate generating the at least one test sequence if the feedback from the slave device indicates that the slave device is not capable of communicating with the master device using the unique clock frequency.

EXAMPLE 22

This example includes the elements of example 21, wherein the instructions that when executed by the one or more processors result in the following additional operations comprising:

set a clock frequency to communicate with the slave to device to the last unique clock frequency at which the slave device provided feedback that the slave device is capable of communicating at that unique clock frequency.

EXAMPLE 23

This example includes the elements of example 17, wherein the instructions that when executed by the one or more processors result in the following additional operations comprising:

exchange commands and data with the slave device using a two-wire serial bus communication protocol.

EXAMPLE 24

This example includes the elements of example 17, wherein the instructions that when executed by the one or more processors result in the following additional operations comprising:

iteratively generate a test sequence, each test sequence having an increasing unique clock frequency.

EXAMPLE 25

This example includes the elements of example 17, wherein the instructions that when executed by the one or more processors result in the following additional operations comprising:

generate the at least one test sequence as an in-band operation during communication with the slave device.

EXAMPLE 26

This example provides a computer-readable storage device of a slave device in a bus system, the computer-readable storage device having stored thereon instructions that when executed by one or more processors result in the following operations comprising:

exchange commands and data with a master device in communication with the slave device;

receive a test sequence and a unique clock signal from the master device, and further to determine if a unique clock frequency associated with the unique clock signal is compatible with a local clock signal of the slave device to enable communication with the master device; and generate a feedback signal, to send to the master device, indicating the capability of the slave device to communicate with the master device using the unique clock frequency.

EXAMPLE 27

This example includes the elements of example 26, wherein the instructions that when executed by the one or more processors result in the following additional operations comprising:

determine a time length of the test sequence received from the master device; and compare the time length of the test sequence to the local clock signal and generate a first output signal having state indicating that the local clock signal has a frequency that is sufficient to sample the test sequence or a second output signal indicating that the local clock signal has a frequency that is insufficient to sample the test sequence.

EXAMPLE 28

This example includes the elements of example 27, wherein the instructions that when executed by the one or more processors result in the following additional operations comprising:

perform at least one error detection operation on the test sequence received from the master device and to generate a first output signal indicating that the error detection operation did not detect any errors in the test sequence received or a second output signal indicating that the error detection operation detected at least one error in the test sequence received; and AND the first or second output signals of the comparison circuitry with the first or second output signals of the error detection circuitry, and generate an output signal indicating the result of the AND operation.

EXAMPLE 29

This example includes the elements of example 26, wherein the instructions that when executed by the one or more processors result in the following additional operations comprising:
store the test sequence received from the slave device; and wherein the feedback signal includes the stored test sequence.

EXAMPLE 30

This example includes the elements of example 26, wherein the instructions that when executed by the one or more processors result in the following additional operations comprising:
generate count data of the test sequence received from the master device; and wherein the feedback signal includes the count data.

EXAMPLE 31

This example includes the elements of example 26, wherein the exchange of commands and data with the master device utilize a two-wire serial bus communication protocol.

EXAMPLE 32

This example includes the elements of example 26, wherein the instructions that when executed by the one or more processors result in the following additional operations comprising: determine if a unique clock frequency associated with the unique clock signal is compatible with a local clock signal of the slave device to enable communication with the master device as an in-band operation during communication with the master device.

EXAMPLE 33

This example includes the elements of example 1, wherein the test sequence generation logic also to generate the test sequence using a plurality of unique encoding schemes.

EXAMPLE 34

This example includes the elements of example 33, wherein the encoding schemes are selected from the group of single data rate (SDR) encoding, double data rate (DDR) encoding, and/or ternary data rate encoding.

EXAMPLE 35

This example includes the elements of example 33, wherein the test sequence logic also to cycle through an available set clock frequencies for each encoding scheme.

EXAMPLE 36

This example includes the elements of example 17, wherein the instructions that when executed by the one or more processors result in the following additional operations comprising:
generate the test sequence using a plurality of unique encoding schemes.

EXAMPLE 37

This example includes the elements of example 36, wherein the encoding schemes are selected from the group of single data rate (SDR) encoding, double data rate (DDR) encoding, and/or ternary data rate encoding.

EXAMPLE 38

This example includes the elements of example 36, wherein the instructions that when executed by the one or more processors result in the following additional operations comprising:
cycle through an available set clock frequencies for each encoding scheme.

EXAMPLE 39

This example provides a method for detecting a communication speed for a master device in a bus system, comprising:
exchanging commands and data with a slave device in communication with the master device; and
generating at least one test sequence, each test sequence having a corresponding unique clock signal having a unique clock frequency;
transmitting the at least one test sequence and the corresponding unique clock signal to the slave device; and
determining, based on feedback from the slave device in response to the test sequence, if the slave device is capable of communicating with the master device using the unique clock frequency.

EXAMPLE 40

This example includes the elements of example 39, wherein the feedback from the slave device includes an acknowledgement signal indicating that the unique clock frequency is compatible with a local clock of the slave device.

EXAMPLE 41

This example includes the elements of example 39, further comprising:
comparing the at least one test sequence generated by the master device to a copy of the at least one test sequence from the slave device.

EXAMPLE 42

This example includes the elements of example 41, further comprising:
generating count data associated with each test sequence, and wherein the feedback from the slave device includes count data generated by the slave device; and
comparing the count data generated by master device to the count data generated by the slave device.

EXAMPLE 43

This example includes the elements of example 39, further comprising:

terminating generating the at least one test sequence if the feedback from the slave device indicates that the slave device is not capable of communicating with the master device using the unique clock frequency.

EXAMPLE 44

This example includes the elements of example 43, further comprising:
setting a clock frequency to communicate with the slave to device to the last unique clock frequency at which the slave device provided feedback that the slave device is capable of communicating at that unique clock frequency.

EXAMPLE 45

This example includes the elements of example 39, further comprising:
exchanging commands and data with the slave device using a two-wire serial bus communication protocol.

EXAMPLE 46

This example includes the elements of example 39, further comprising:
iteratively generating the test sequence, each test sequence having an increasing unique clock frequency.

EXAMPLE 47

This example includes the elements of example 39, further comprising:
generating the at least one test sequence as an in-band operation during communication with the slave device.

EXAMPLE 48

This example provides a method for determining a communication speed for a slave device in a bus system, comprising:
exchanging commands and data with a master device in communication with the slave device;
receiving a test sequence and a unique clock signal from the master device;
determining if a unique clock frequency associated with the unique clock signal is compatible with a local clock signal of the slave device to enable communication with the master device; and
generating a feedback signal, to send to the master device, indicating the capability of the slave device to communicate with the master device using the unique clock frequency.

EXAMPLE 49

This example includes the elements of example 48, further comprising:
determining a time length of the test sequence received from the master device; and
comparing the time length of the test sequence to the local clock signal; and
generating a first output signal having state indicating that the local clock signal has a frequency that is sufficient to sample the test sequence or a second output signal indicating that the local clock signal has a frequency that is insufficient to sample the test sequence.

EXAMPLE 50

This example includes the elements of example 49, further comprising:

performing at least one error detection operation on the test sequence received from the master device and to generate a first output signal indicating that the error detection operation did not detect any errors in the test sequence received or a second output signal indicating that the error detection operation detected at least one error in the test sequence received; and
ANDing the first or second output signals of the comparison circuitry with the first or second output signals of the error detection circuitry, and generate an output signal indicating the result of the ANDing operation.

EXAMPLE 51

This example includes the elements of example 48, further comprising:
storing the test sequence received from the master device; and wherein the feedback signal includes the stored test sequence.

EXAMPLE 52

This example includes the elements of example 48, further comprising:
generating count data of the test sequence received from the master device; and wherein the feedback signal includes the count data.

EXAMPLE 53

This example includes the elements of example 48, wherein the exchange of commands and data with the master device utilize a two-wire serial bus communication protocol.

EXAMPLE 54

This example includes the elements of example 48, further comprising:
determining if a unique clock frequency associated with the unique clock signal is compatible with a local clock signal of the slave device to enable communication with the master device as an in-band operation during communication with the master device.

EXAMPLE 55

This example includes the elements of example 39, further comprising generating the test sequence using a plurality of unique encoding schemes.

EXAMPLE 56

This example includes the elements of example 55, wherein the encoding schemes are selected from the group of single data rate (SDR) encoding, double data rate (DDR) encoding, and/or ternary data rate encoding.

EXAMPLE 57

This example includes the elements of example 55, further comprising cycling through an available set clock frequencies for each encoding scheme.

EXAMPLE 58

This example provides a system that includes the elements of any of the examples 39 to 47.

EXAMPLE 59

This example provides a system that includes any of the examples 48 to 54.

EXAMPLE 60

This example provides means to perform the method of any one of examples 39 to 47.

EXAMPLE 61

This example provides means to perform the method of any one of examples 48 to 54.

EXAMPLE 62

This example provides a computer readable storage device having stored thereon instructions that when executed by one or more processors result in the following operations comprising: the method according to any one of claims 39-47.

EXAMPLE 63

This example provides a computer readable storage device having stored thereon instructions that when executed by one or more processors result in the following operations comprising: the method according to any one of claims 48-54.

In the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment.

What is claimed is:

1. A source device in a bus system, comprising:
    bus interface circuitry to exchange commands and data with a receiver device in communication with the source device; and
    test sequence generation logic to generate a plurality of test sequences, each respective one of the test sequences included in the plurality of test sequences having a corresponding unique clock signal having a unique clock frequency; the test sequence generation logic also to transmit each of the plurality of test sequences and the corresponding unique clock signal to the receiver device; the test sequence generation logic also to determine, based on feedback from the receiver device, if the receiver device is capable of communicating with the source device using the respective unique clock frequency.

2. The source device of claim 1, wherein the feedback from the receiver device includes an acknowledgement signal indicating that the respective unique clock frequency is compatible with a local clock of the receiver device.

3. The source device of claim 1, wherein the source device further includes comparison logic and wherein the feedback from the receiver device includes a copy of the respective test sequence from the receiver device; the comparison logic to compare the respective test sequence generated by the test sequence generation logic to the copy of the respective test sequence received from the receiver device.

4. The source device of claim 1, wherein the test sequence generation logic also to terminate generating the plurality of test sequences if the feedback from the receiver device indicates that the receiver device is not capable of communicating with the source device using any of the unique clock frequencies corresponding to respective ones of the plurality of test sequences.

5. The source device of claim 1, wherein the bus interface circuitry is configured to exchange commands and data with the receiver device using a two-wire serial bus communication protocol.

6. The source device of claim 1, wherein the plurality of test sequences comprises a plurality of iteratively generated test sequences, each of the plurality of iteratively generated test sequences having a corresponding increasing unique clock frequency.

7. The source device of claim 1, wherein the test sequence generation logic also to generate the plurality of test sequences as an in-band operation during communication with the receiver device.

8. The source device of claim 3, wherein test sequence generation logic also to generate count data associated with each respective one of the plurality of test sequences, and wherein the feedback from the receiver device includes count data generated by the receiver device; and wherein the comparison logic also to compare the count data generated by the test sequence generation logic to the count data generated by the receiver device.

9. The source device of claim 4, wherein the test sequence generation logic also to set a clock frequency to communicate with the receiver device to the last unique clock frequency at which the receiver device provided feedback that the receiver device is capable of communicating at that unique clock frequency.

10. A receiver device in a bus system, comprising:
    bus interface circuitry to exchange commands and data with a source device in communication with the receiver device;
    test circuitry to receive a test sequence and a unique clock signal from the source device, and further to determine if a unique clock frequency associated with the unique clock signal is compatible with a local clock signal of the receiver device to enable communication with the source device; the test circuitry also to generate a feedback signal, to send to the source device, indicating the capability of the receiver device to communicate with the source device using the unique clock frequency;
    test sequence length detection circuitry to determine a time length of the test sequence received from the source device; and
    comparison circuitry to compare the time length of the test sequence to the local clock signal and generate a first output signal having state indicating that the local clock signal has a frequency that is sufficient to sample the test sequence or a second output signal indicating that the local clock signal has a frequency that is insufficient to sample the test sequence.

11. The receiver device of claim 10, wherein the test circuitry further comprising:
    error detection circuitry to perform at least one error detection operation on the test sequence received from the source device and to generate a first output signal indicating that the error detection operation did not detect any errors in the test sequence received or a second output signal indicating that the error detection operation detected at least one error in the test sequence received; and AND circuitry to AND the first or second output signals of the comparison circuitry with the first or second output signals of the error detection circuitry, the AND circuitry also to generate an output signal indicating the result of the AND operation; and wherein the feedback signal includes the output of the AND circuitry.

12. The receiver device of claim 10, wherein the test circuitry comprising:

buffer circuitry to store the test sequence received from the receiver device; and wherein the feedback signal includes the test sequence stored in the buffer.

13. The receiver device of claim 10, wherein the test circuitry comprising:

count circuitry to generate count data of the test sequence received from the source device; and wherein the feedback signal includes the count data.

14. The receiver device of claim 10, wherein the bus interface circuitry is configured to exchange commands and data with the source device using a two-wire serial bus communication protocol.

15. The receiver device of claim 10, wherein the test circuitry also to determine if a unique clock frequency associated with the unique clock signal is compatible with a local clock signal of the receiver device to enable communication with the source device as an in-band operation during communication with the source device.

16. A computer-readable storage device of a source device in a bus system, the computer-readable storage device having stored thereon instructions that when executed by one or more processors result in the following operations comprising:

exchange commands and data with a receiver device in communication with the source device;

generate a plurality of test sequences, each respective one of the plurality of test sequences having a corresponding unique clock signal having a unique clock frequency;

transmit each of the plurality of test sequences and the corresponding unique clock signal to the receiver device; and determine, based on feedback from the receiver device, if the receiver device is capable of communicating with the source device using the respective unique clock frequency.

17. The computer-readable storage device of claim 16, wherein the feedback from the receiver device includes an acknowledgement signal indicating that the respective unique clock frequency is compatible with a local clock of the receiver device.

18. The computer-readable storage device of claim 16, wherein the instructions that when executed by the one or more processors result in the following additional operations comprising:

compare each of the plurality of test sequences generated by the source device to a copy of the respective test sequence received from the receiver device.

19. The computer-readable storage device of claim 16, wherein the instructions that when executed by the one or more processors result in the following additional operations comprising:

terminate generating the plurality of test sequences if the feedback from the receiver device indicates that the receiver device is not capable of communicating with the source device using any of the unique clock frequencies corresponding to respective ones of the plurality of test sequences.

20. The computer-readable storage device of claim 16, wherein the instructions that when executed by the one or more processors result in the following additional operations comprising:

exchange commands and data with the receiver device using a two-wire serial bus communication protocol.

21. The computer-readable storage device of claim 16, wherein the instructions that when executed by the one or more processors result in the following additional operations comprising:

generate the plurality of test sequences by iteratively generating a test sequence, each of the plurality of iteratively generated test sequences having a corresponding increasing unique clock frequency.

22. The computer-readable storage device of claim 16, wherein the instructions that when executed by the one or more processors result in the following additional operations comprising:

generate the plurality of test sequences as an in-band operation during communication with the receiver device.

23. The computer-readable storage device of claim 18, wherein the instructions that when executed by the one or more processors result in the following additional operations comprising:

generate count data associated with each respective one of the plurality of test sequences, and wherein the feedback from the receiver device includes count data generated by the receiver device; and compare the count data generated by source device to the count data generated by the receiver device.

24. The computer-readable storage device of claim 19, wherein the instructions that when executed by the one or more processors result in the following additional operations comprising:

set a clock frequency to communicate with the receiver device to the last unique clock frequency at which the receiver device provided feedback that the receiver device is capable of communicating at that unique clock frequency.

* * * * *